US010656188B2

(12) United States Patent
Ibrahim et al.

(10) Patent No.: US 10,656,188 B2
(45) Date of Patent: May 19, 2020

(54) CIRCUIT AND METHOD FOR LOAD DETECTION USING SWITCHED CAPACITORS

(71) Applicant: Vidatronic Inc., College Station, TX (US)

(72) Inventors: Sameh Ahmed Assem Ibrahim, Cairo (EG); Faisal Abdellatif Elseddeek Hussien, Cairo (EG); Mohamed Mostafa Saber Aboudina, Giza (EG); Mohamed Ahmed Mohamed El-Nozahi, Cairo (EG)

(73) Assignee: Vidatronic Inc., College Station, TX (US)

( * ) Notice: Subject to any disclaimer, the term of this patent is extended or adjusted under 35 U.S.C. 154(b) by 0 days.

(21) Appl. No.: 15/650,836

(22) Filed: Jul. 14, 2017

(65) Prior Publication Data

US 2018/0113158 A1    Apr. 26, 2018

Related U.S. Application Data

(60) Provisional application No. 62/362,157, filed on Jul. 14, 2016.

(51) Int. Cl.
*G01R 19/165*   (2006.01)
*H03K 17/687*   (2006.01)
*G01R 31/64*    (2020.01)

(52) U.S. Cl.
CPC ..... *G01R 19/16504* (2013.01); *H03K 17/687* (2013.01); *G01R 19/16595* (2013.01); *G01R 31/64* (2020.01)

(58) Field of Classification Search
CPC ................. G01R 19/16504; G01R 19/16595
See application file for complete search history.

(56) References Cited

U.S. PATENT DOCUMENTS

| 7,091,752 B2 * | 8/2006 | Balakrishnan .... | H02M 3/33592 327/108 |
| 2011/0031984 A1 * | 2/2011 | Hashimoto ........ | G01R 31/3004 324/678 |
| 2013/0093440 A1 * | 4/2013 | Aumann ............ | H05B 33/0848 324/691 |

* cited by examiner

*Primary Examiner* — Jas A Sanghera
(74) *Attorney, Agent, or Firm* — Liang Legal Group, PLLC; T. Chyau Liang

(57) ABSTRACT

A load detection circuit includes a variable current source circuit having a first input connected to a power supply, a second input, and a first output connected to an output load; a switched capacitor circuit having a third input connected to an external voltage reference signal, a fourth input connected to the first output of the variable current source, a fifth input connected to ground, a sixth input, and a second output; a comparator having a seventh input connected to the second output of the switched capacitor circuit, an eighth input connected to the first output of the variable current source, and a third output; an edge detector having a ninth input connected to the third output of the comparator, and a fourth output; and a digital controller having a fifth output connected to the variable current source and a sixth output connected to the switched capacitor circuit.

15 Claims, 3 Drawing Sheets

CIRCUIT AND METHOD FOR LOAD DETECTION USING SWITCHED CAPACITORS

CROSS REFERENCE TO RELATED APPLICATIONS

This claims the benefit of U.S. Provisional Application No. 62/362,157, filed on Jul. 14, 2016, the disclosure of which is incorporated by reference in its entirety.

BACKGROUND

A load detection circuit is a circuit that generates an indicator signal to determine whether the load capacitor is higher or lower than a pre-specified value. This has to be done in the presence of an unknown resistive load. The load can be an external load or an internal load to the chip. The indicator signal can then be used in applications for various purposes, such as, but not limited to, stabilizing a power management unit.

FIG. 1(A) shows a prior art load detection circuit. The supply is defined as VDD (101), the ground is defined as GND (102), the output indicator signal is defined as HC (103), the clock signal is defined as CLK (104), and the reference voltage signals are defined as REF1 (105) and REF2 (106). The implementation shown in FIG. 1(A) represents a load detection circuit with a variable current source (107), a variable gain amplifier (VGA, 108), two comparators (109 and 110), and two counters (111 and 112).

In each clock cycle, the counters increment their counts by one. The current source (107) initially starts to charge the load capacitor CL (113) in the presence of the load resistor RL (114). As a result, the output voltage $V_{out}$ starts to increase with time. After a fixed time period, the gain of the variable gain amplifier (108) is increased. At the same time, counter (111) is incrementing with time based on the clock. This continues until the variable gain amplifier (VGA, 108) output reaches REF1 (105). This is detected by a comparator (109). The counter final count is proportional to the load resistor RL (114). After that, the current source (107) is incremented and CL (113) is recharged. At the same time, the counter (112) is incrementing with time based on the clock. Once the output voltage $V_{out}$ reaches a pre-specified value, the counter stops counting at a final count. The pre-specified value is determined by REF2 (106) and detected by a comparator (110). The final count is proportional to the load capacitor CL (113). In other words, a higher final count corresponds to a larger load capacitance value, and vice versa. Accordingly, the final count represents an estimate of the load capacitance of CL (113).

As depicted in FIG. 1(B), the timing diagram of the prior art load detection circuits shows a variable time load detection methodology. The discharge phase (115) is fixed in time, while the resistor detection phase (116) is variable in time, and the capacitor detection phase time duration (117) depends on the value of the load capacitor.

The prior art analog circuit (100) depicted in FIG. 1(A) uses a load detection circuit to detect whether an output capacitance is higher than a pre-specified value, but the overall time that it takes to perform the load detection operation (e.g. $t_{dis}+t_{ch}+t_{rch}$) is variable. Therefore, this approach does not support a fixed-time load detection mechanism. Therefore, there is a need for better implementation for load detection with a pre-determined and predictable duration time.

SUMMARY

In general, in one aspect, the invention relates to a novel architecture to enhance the accuracy of load detection circuits by using switched capacitors.

One aspect of the invention relates to load detection circuits. A load detection circuit in accordance with one embodiment of the invention comprises a variable current source circuit having a first input connected to a power supply, a second input, and a first output connected to an output load; a switched capacitor circuit having a third input connected to an external voltage reference signal, a fourth input connected to the first output of the variable current source, a fifth input connected to ground, a sixth input, and a second output; a comparator having a seventh input connected to the second output of the switched capacitor circuit, an eighth input connected to the first output of the variable current source, and a third output; an edge detector having a ninth input connected to the third output of the comparator, and a fourth output; and a digital controller having a fifth output connected to the second input of the variable current source and a sixth output connected to the sixth input of the switched capacitor circuit.

In accordance with the above embodiment of the invention, the variable current source may produce a specific current that can be changed using a control signal. The switched capacitor circuit has a switchable capacitor whose terminal connections can be changed using control signals. The comparator produces a logic high at the third output if the seventh input is higher than the eighth input and produces a logic low otherwise. The comparator may or may not use offset cancellation. The edge detector produces a logic high at the fourth output when reset at startup and produces a logic low at the fourth output when a logic transition from high to low occurs at the ninth input.

In accordance with some embodiments of the invention, the digital controller may produce fixed period control signals at the fifth output to control the variable current source. In accordance with some embodiments of the invention, the digital controller may produce fixed period control signals at the sixth output to control the switched capacitor circuit.

In accordance with some embodiments of the invention, the digital controller can use an external clock signal to generate a control signal. In accordance with some embodiments of the invention, a reference voltage signal can be generated internally using a bandgap current passing through a resistor. In accordance with some embodiments of the invention, a reference voltage signal can be generated internally using a bandgap current charging an internal capacitor for a fixed period of time.

Other aspects of the invention would become apparent with the following description and the included drawings, which form part of the description.

BRIEF DESCRIPTION OF DRAWINGS

The appended drawings are used to illustrate embodiments of the invention and are not meant to limit the scope of the invention.

DETAILED DESCRIPTION

Figure 1A:
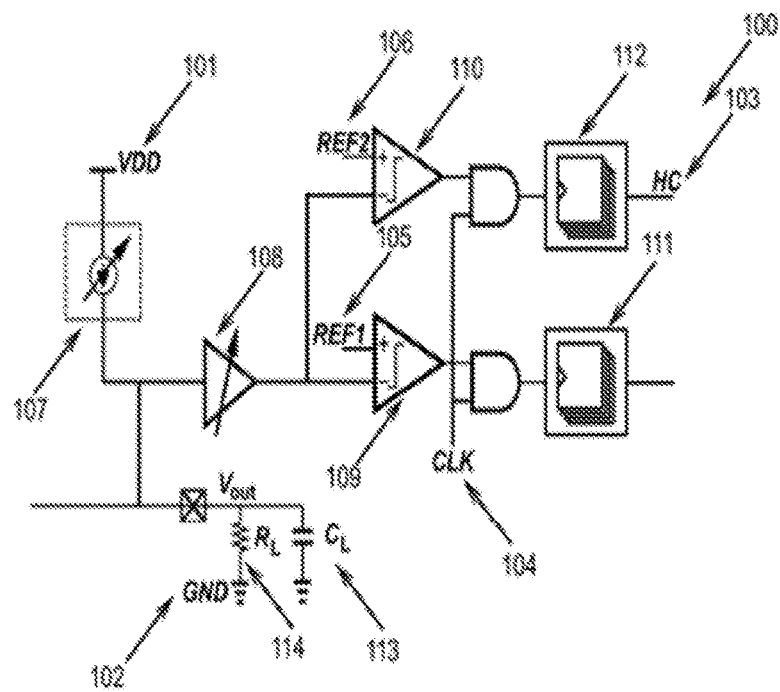
FIG. 1(A) shows a schematic block level circuit diagram of a prior art load-detection circuit.

Aspects of the present invention are shown in the above-identified drawings and are described below. In the description, like or identical reference numerals are used to identify common or similar elements. The drawings are not necessarily to scale and certain features may be shown exaggerated in scale or in schematic in the interest of clarity and conciseness.

Figure 1B:
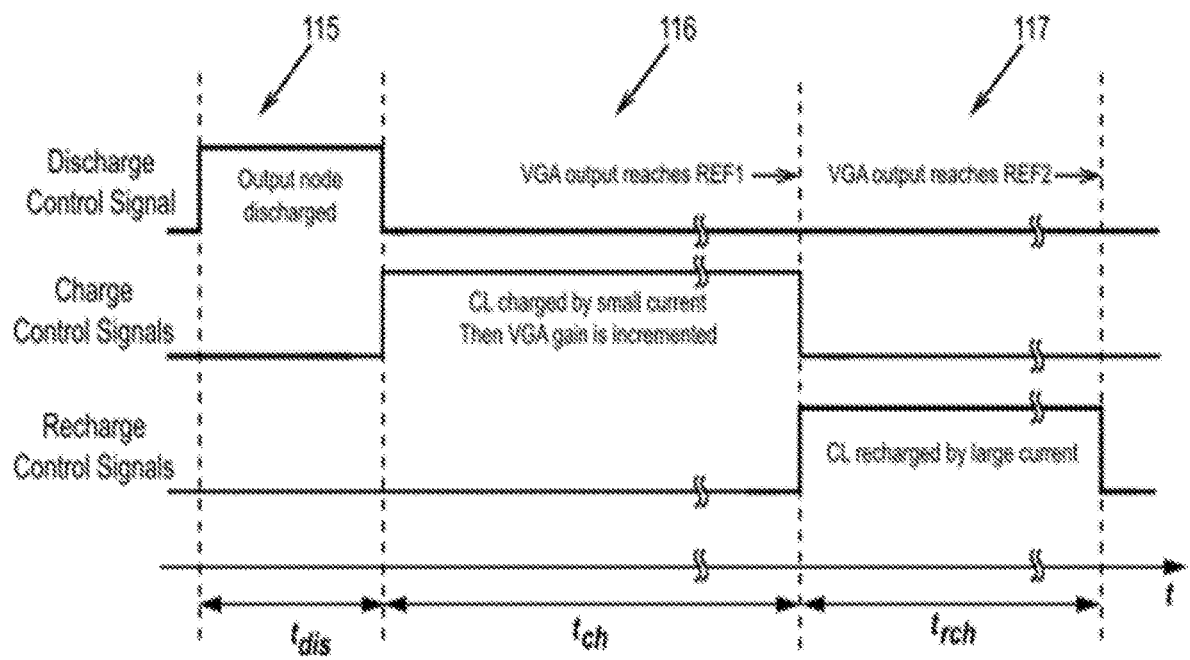
FIG. 1(B) shows a timing diagram of the prior art load-detection circuit shown in FIG. 1(A).

Embodiments of the invention relate to a load detection circuit comprising a switched capacitor block. In accordance with embodiments of the invention, the duration of the load detection period is independent of a load capacitance CL (113 in FIG. 1 and 210 in FIG. 2). In accordance with some embodiments of the invention, the improved load detection circuits may have fixed detection times of less than 300 μs. As noted above, in the prior art, the load detection time is dependent on the load capacitor CL (113) in FIG. 1. Those skilled in the art, with the benefit of this disclosure, will appreciate that same or similar features are equally applicable to any system, the performance of which depends on the value of the load capacitor.

In accordance with some embodiments of the invention, a load detection circuit using switched capacitors may be implemented on a microchip, such as a semiconductor integrated circuit. Throughout this disclosure, the terms "load detection circuit," "high accuracy load detection circuit," "improved load detection circuit," and "switched capacitor load detection circuit" may be used interchangeably depending on the context.

Figure 2:
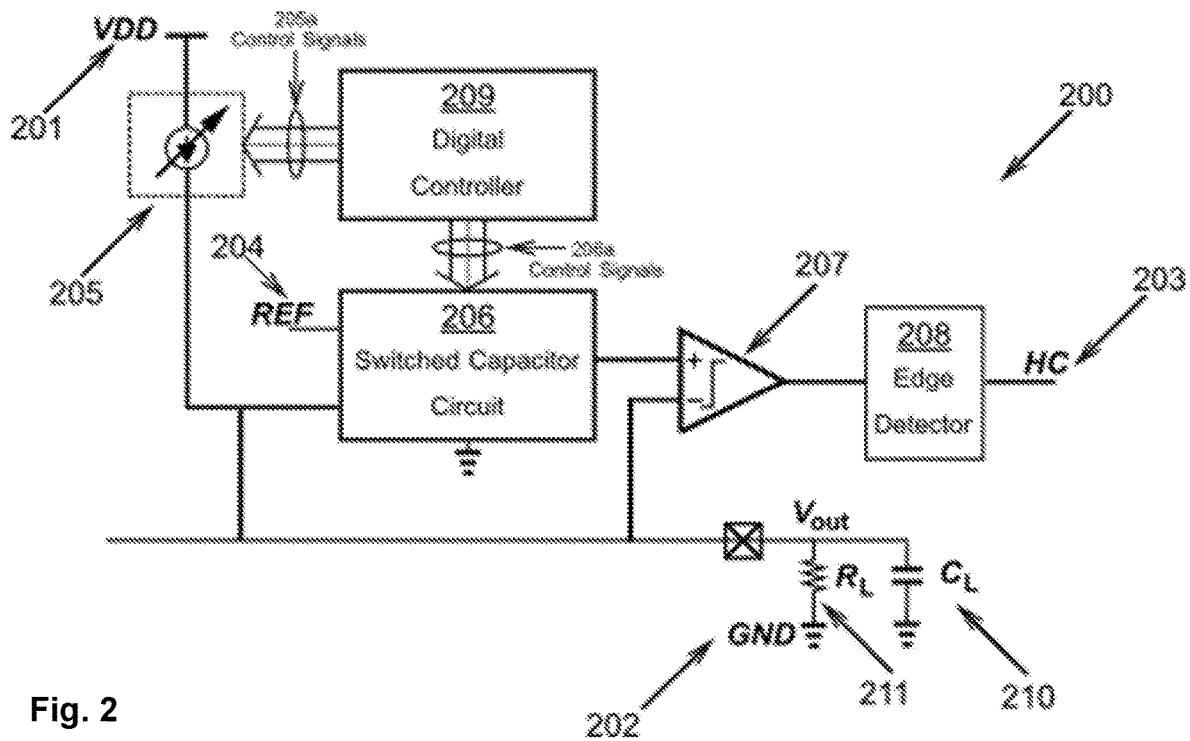
FIG. 2 shows a block diagram of a load detection circuit in accordance with one embodiment of the invention.

FIG. 2 shows a schematic block-level diagram of an improved load detection circuit (200) in accordance with one embodiment of the invention. As shown in FIG. 2, an improved load detection circuit (200) includes an input supply VDD (201), a ground GND (202), an output indicator signal HC (203), a reference voltage REF (204), a variable current source (205), a switched capacitor circuit (206), a comparator (207), an edge detector (208), and a digital controller (209). The load, consisting of a load capacitor CL (210) and a load resistor RL (211), is connected at the output of the load detection circuit.

Possible implementations of the variable current source (205) may include, but are not limited to, switched metal-oxide-semiconductor (MOS) transistors and/or MOS transistors with variable gate voltages. The variable current source (205) is a circuit that produces a specific current signal that can be changed using a control signal. The switched capacitor circuit (206) may comprise a capacitor and switches. The capacitor can be implemented by, but are not limited to, MOS capacitor, metal-insulator-metal (MIM) capacitor, metal-oxide-metal (MOM) capacitor, and/or an off-chip capacitor. The switches can be implemented by, but are not limited to, MOS transistors and/or transmission gates.

The switched capacitor circuit (206) is a circuit that has a switchable capacitor, the terminal connections of which can be changed using control signals. In accordance with one or more embodiments of the invention, the comparator (207) may be, but are not limited to, a static comparator, a dynamic comparator, a single-stage amplifier, and/or a multi-stage amplifier. The comparator may or may not have offset cancellation techniques implemented. The comparator (207) is a circuit that generates a high output signal whenever its positive input terminal has a voltage higher than its negative input terminal.

Possible implementations of the edge detector (208) may include, but are not limited to, a D flip-flop with reset and/or an SR latch. The edge detector (208) produces a permanent output low or high whenever a transition occurs at its input. The digital controller (209) can be implemented by, but are not limited to, logic standard cells and/or full-custom digital. The digital controller (209) is responsible for generating the control signals for the variable current source (205) and the switched capacitor circuit (206). It can do this with or without an external clock source.

In accordance with one or more embodiments of the invention, one or more of the modules and elements shown in FIG. 2 may be omitted, repeated, and/or substituted. Accordingly, embodiments of the invention should not be considered limited to the specific arrangements of modules shown in FIG. 2.

In accordance with one or more embodiments of the invention, having a fixed load detection time, which is independent of the value of the load capacitor CL (210 in FIG. 2), is achieved by using fixed period control signals (205a and 206a in FIG. 2) produced by the digital controller (209). The control signals (205a) control the value of the current produced by the variable current source (205), and the control signals (206a) change the configuration of the switched capacitor circuit (206).

The operation of the circuit can be explained as follows: First, the variable current source (205) is set to produce a small fixed current. At the same time, the switched capacitor circuit (206) may be configured to allow this current to charge the switchable capacitor. This may be done by connecting the switchable capacitor between the variable current source (205) and GND (202). This continues for a fixed time period until the switchable capacitor is fully charged. The time may be pre-determined based on the maximum CL (210) and RL (211) allowed.

Next, the control signals are changed to increase the current produced by the variable current source (205) and to connect the switchable capacitor of the switched capacitor circuit (206) between REF (204) and the positive input terminal of the comparator (207). The negative input terminal of the comparator (207) is connected to $V_{out}$. This continues for a small fixed time duration that is chosen based on a pre-determined value of load capacitor CL (210) to be detected. If at the end of this time duration, $V_{out}$ is higher than the output of the switched capacitor circuit (206), the comparator (207) produces an output "LOW" indicating a load capacitor CL (210) lower than the pre-determined value. The edge detector (208) then produces HC signal (203) "LOW." The opposite logic values are generated on the comparator output and HC, if by the end of this period $V_{out}$ is lower than the output of the switched capacitor circuit (206) indicating that CL (210) is higher than the pre-determined value.

Figure 3:
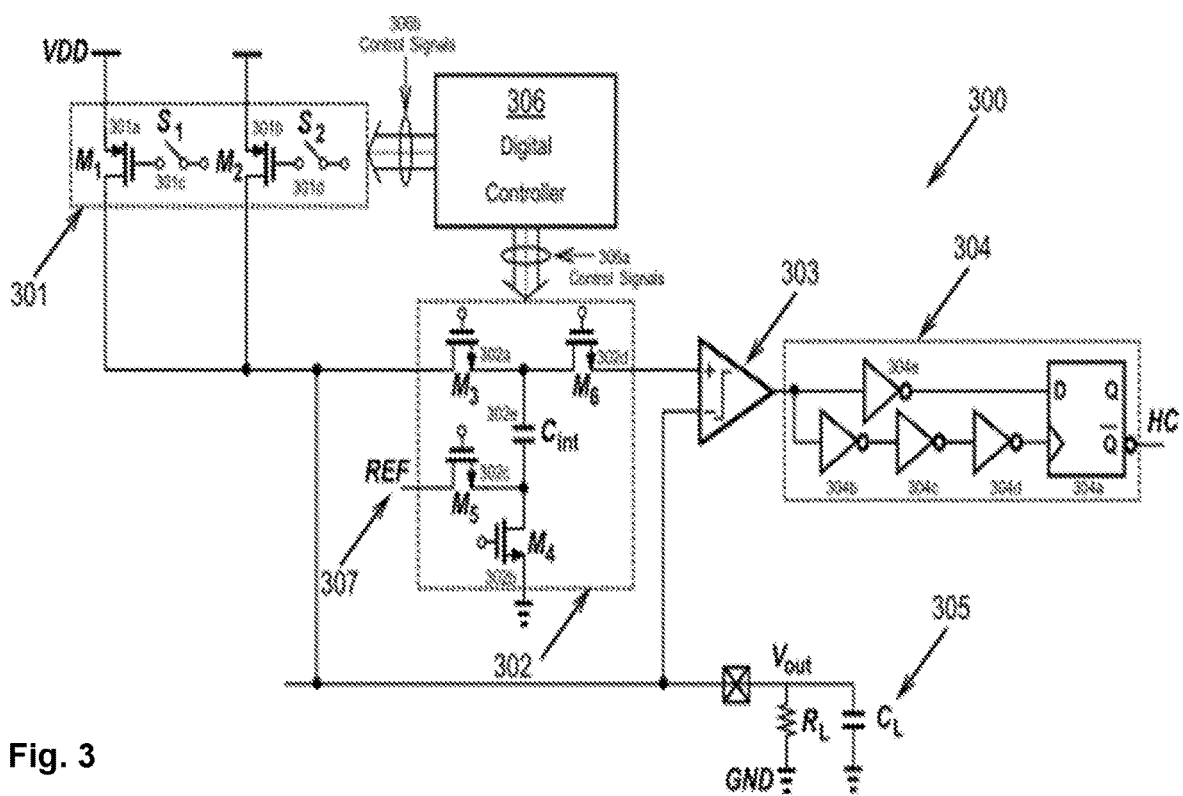
FIG. 3 shows one possible implementation of a load detection circuit in accordance with one embodiment of the invention.

FIG. 3 shows a possible implementation of a load detection circuit in accordance with another embodiment of the invention. In this case, a variable current-source circuit (205 in FIG. 2 and 301 in FIG. 3) may be implemented using a transistor M1 (301a), a transistor M2 (301b), a switch S1 (301c), and a switch S2 (301d). Transistor M1 is responsible for producing a small current value, and transistor M2 adds an extra current to produce a larger current value. The switched capacitor circuit (206 in FIG. 2 and 302 in FIG. 3) may be implemented using transistors M3 (302*a*), M4 (302*b*), M5 (302*c*), M6 (302*d*), and a capacitor Cint (302*e*). Transistors M3, M4, M5, and M6 are used as switches. M3 and M4 are ON in the first phase when the low current is used. In contrast, M5 and M6 are ON in the second phase when the large current is used. The comparator (207 in FIG. 2 and 303 in FIG. 3) may be implemented using a conventional two-stage operational amplifier. Finally, the edge detector (208 in FIG. 2 and 304 in FIG. 3) may be implemented using a conventional D flip-flop with reset (304*a*) and four CMOS inverters (304*b*, 304*c*, 304*d*, and 304*e*).

Figure 4:
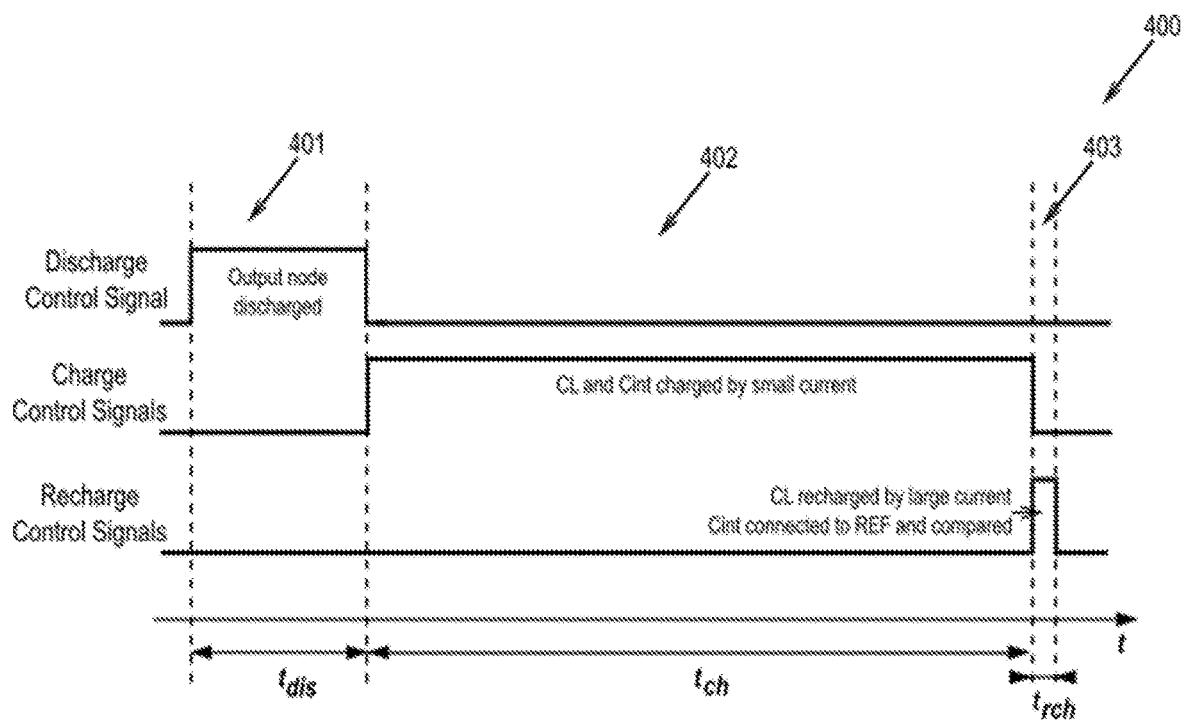
FIG. 4 shows an example of a timing diagram of a load detection circuit in accordance with the one embodiment of the invention.

FIG. 4 shows an exemplary timing diagram of a switched capacitor load detection circuit in accordance with one embodiment of the invention. The first phase (401) corresponds to discharging of the output. The second phase (402) corresponds to charging of the internal capacitor Cint (302*e* in FIG. 3) and the load capacitor CL (305 in FIG. 3) with the small current value. During the third and final phases (403), the current is increased, Cint (302*e*) is connected between REF (307 in FIG. 3) and the comparator (303 in FIG. 3), CL (305) is recharged by a higher current, and $V_{out}$ is compared to the switched capacitor circuit (302 in FIG. 3) output. It is clear that the three phases require fixed time periods, resulting in fixed time load detection.

Figure 5:
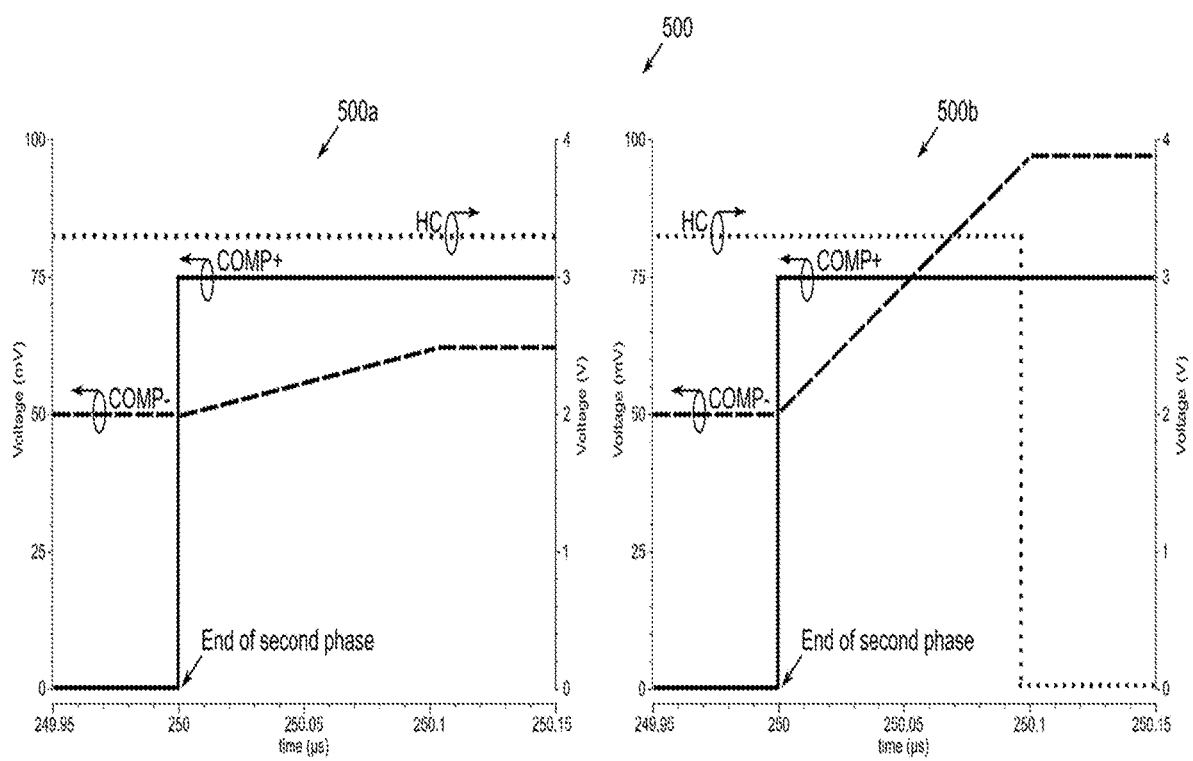
FIG. 5 shows exemplary simulation results for a load detection circuit in accordance with embodiments of the invention.

FIG. 5 shows exemplary simulation results for the load detection circuit (300) shown in FIG. 3. Specifically, FIG. 5 shows the voltage at the two input terminals of the comparator (303 in FIG. 3) in two cases: when CL (305) is higher than the pre-determined value (500*a*) and when CL (305) is lower than the pre-determined value (500*b*). In the case (500*a*), where CL (305) is higher than the predetermined value, the positive terminal voltage doesn't exceed the negative terminal voltage, resulting in an HC signal "HIGH." In contrast, in the case (500*b*), where CL (305) is lower than the predetermined value, the positive terminal voltage exceeds that of the negative terminal, resulting in an HC signal "LOW."

Advantages of the invention may include one or more of the following. A load detection circuit of the invention comprises a switched capacitor, which allows for a fixed-time load detection. The switched capacitor circuit may comprise a capacitor and switches. The capacitor can be implemented by, but are not limited to, MOS capacitor, metal-insulator-metal (MIM) capacitor, metal-oxide-metal (MOM) capacitor, and/or an off-chip capacitor. The switches can be implemented by, but are not limited to, MOS transistors and/or transmission gates. A load detection circuit of the invention using switched capacitors may be implemented on a microchip, such as a semiconductor integrated circuit.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A load detection circuit, comprising:
   a switched capacitor circuit, an output of which is connected to a positive input of a comparator;
   an output capacitor connected to a negative input of the comparator; and
   an edge detector connected to an output of the comparator, wherein the edge detector is configured to generate an output indicator signal based on a signal from the comparator;
   wherein a load detection time of the load detection circuit has a fixed time duration.

2. The load detection circuit of claim 1, wherein the switched capacitor circuit comprises a capacitor and one or more switches.

3. A load detection circuit, comprising:
   a variable current source circuit having a first input connected to a power supply, a second input, and a first output connected to an output load;
   a switched capacitor circuit having a third input connected to an external voltage reference signal, a fourth input connected to the first output of the variable current source circuit, a fifth input connected to ground, a sixth input, and a second output;
   a comparator having a seventh input connected to the second output of the switched capacitor circuit, an eighth input connected to the first output of the variable current source circuit, and a third output;
   an edge detector having a ninth input connected to the third output of the comparator, and a fourth output;
   a digital controller having a fifth output connected to the second input of the variable current source circuit and a sixth output connected to the sixth input of the switched capacitor circuit, and
   wherein a load detection time of the load detection circuit has a fixed time duration.

4. The load detection circuit according to claim 3, wherein the variable current source circuit produces a specific current that can be changed using a control signal.

5. The load detection circuit according to claim 3, wherein the switched capacitor circuit has a switchable capacitor whose terminal connections can be changed using control signals.

6. The load detection circuit of claim 3, wherein the comparator produces a logic high at the third output if the seventh input is higher than the eighth input and produces a logic low if the seventh input is lower than the eighth input.

7. The load detection circuit of claim 3, wherein the comparator uses offset cancellation.

8. The load detection circuit of claim 3, wherein the comparator does not use offset cancellation.

9. The load detection circuit of claim 3, wherein the edge detector produces a logic high at the fourth output when reset at startup and produces a logic low at the fourth output when a logic transition from high to low occurs at the ninth input.

10. The load detection circuit of claim 3, wherein the digital controller produces fixed period control signals at the fifth output to control the variable current source circuit.

11. The load detection circuit of claim 3, wherein the digital controller produces fixed period control signals at the sixth output to control the switched capacitor circuit.

12. The load detection circuit of claim 3, wherein the digital controller can use an external clock signal to generate a control signal.

13. The load detection circuit of claim 3, wherein a reference voltage signal can be generated internally using bandgap current passing through a resistor.

14. The load detection circuit of claim 3, wherein a reference voltage signal can be generated internally using bandgap current charging an internal capacitor for the fixed time duration.

15. A method for generating a signal indicating whether a load capacitor is higher or lower than a pre-determined value, the method comprising:

produced a fixed current from a variable current source to fully charge a switchable capacitor in a switched capacitor circuit;

connecting the switchable capacitor between a reference voltage and a positive input terminal of a comparator;

connecting a negative input terminal of the comparator to $V_{out}$ of a circuit comprising the load capacitor and a resistive load;

after a pre-determined duration, producing an output LOW indicating a load at the load capacitor is lower than the pre-determined value if $V_{out}$ is higher than an output of the switched capacitor circuit, or producing an output HIGH indicating the load at the load capacitor is higher than the pre-determined value if $V_{out}$ is lower than the output of the switched capacitor circuit.

* * * * *